United States Patent [19]

Armstrong

[11] 3,777,216

[45] Dec. 4, 1973

[54] AVALANCHE INJECTION INPUT PROTECTION CIRCUIT

[75] Inventor: William E. Armstrong, Tempe, Ariz.

[73] Assignee: Motorola Inc., Franklin Park, Ill.

[22] Filed: Oct. 2, 1972

[21] Appl. No.: 294,407

[52] U.S. Cl. ................ 317/31, 307/235 G, 307/304, 317/33 SC, 317/43

[51] Int. Cl. ................ H02h 3/20

[58] Field of Search ................ 317/31, 43, 33 SC; 307/235 G, 235 T, 235 B, 304

[56] References Cited

UNITED STATES PATENTS

| | | | |
|---|---|---|---|
| 3,395,290 | 7/1968 | Farina et al. | 317/235 G |
| 3,403,270 | 9/1968 | Pace et al. | 317/235 G |
| 3,555,374 | 1/1971 | Usuda | 317/235 G |
| 3,673,428 | 6/1972 | Athanas | 317/235 G |

*Primary Examiner*—James D. Trammell
*Attorney*—Vincent J. Rauner et al.

[57] ABSTRACT

A circuit is provided for protecting an insulated gate field-effect transistor (IGFET) circuit from damage caused by spurious, high voltage input resulting primarily from static charge. The protection circuit is another IGFET whose drain is connected to the gate of the IGFET to be protected and whose source is connected to a common terminal. Also included in the protection circuit is a p-n junction. The gate of the protection circuit IGFET is connected to the p-n junction whose other terminal is connected to the common terminal and which is connected to be reverse biased. The protection circuit IGFET goes into an avalanche condition when a spurious signal of a polarity to cause a reverse bias is of sufficient amplitude to start an injection of carriers from the drain to the gate. The avalanche condition is maintained until the drain voltage drops below the avalanche maintenance value, at which time the p-n junction permits the charge built up on the gate as a result of the avalanche, to leak to the substrate.

4 Claims, 2 Drawing Figures

AVALANCHE INJECTION INPUT PROTECTION CIRCUIT

BACKGROUND OF THE INVENTION

1. Field of the Invention

This invention relates to protection of electronic circuits from damage caused by spurious input voltages. Specifically, it relates to a protection scheme for protecting IGFET circuits from having the insulation between the gate and substrate damaged by the spurious voltage. The spurious voltage is bypassed before it reaches the gate of the IGFET to be protected and thereby causes no damage.

2.Description of the Prior Art

In a typical IGFET circuit, the input is applied to the gate of one or more IGFET's. The insulating layer between the gate and the substrate of the IGFET is made very thin so that the gate of the IGFET may be used effectively to create a field in the substrate. The input circuit is a very high impedance circuit with no inherent shunt paths. With the thin insulating gage layer, a large, transient voltage may drive through the input circuit to the gate and through the insulating layer, causing an open circuit, or more often, it is believed, a short circuit.

The unwanted voltage input comes about through handling in the manufacturing process. Static charges are built up through the use of soldering irons, machinery and particularly through handling by persons. The static charge may be of very large voltage amplitude, thus easily damaging the insulating layer beneath the gate of the IGFET to which the input is connected. The circumstances causing such static charges are difficult to eliminate and therefore there has been a continuing effort to protect the IGFET circuit against those spurious signals which most certainly occur.

Probably the first effort at circuit protection was simply connecting a diode between the input and the substrate upon which the IGFET is formed. The diode is connected so that when a spurious signal occurs at the input, it is immediately conducted to the substrate when the diode is forward biased. When the incoming spurious signal is of a polarity to reverse bias the diode, it is necessary that the diode go into a reverse current condition at some potential lower than the potential necessary to damage the insulating layer under the gate of the main circuit IGFET. This type of protection circuit has proved unsatisfactory because of the observable diode characteristic of its reverse breakdown characteristic increasing after each successive breakdown conduction. That is, after a period of time, the reverse breakdown voltage of the diode may well be higher than that of the IGFET critical voltage.

This diode protection scheme has been carefully studied in the prior art and has resulted in back-to-back diode arrangements and in the development of field plate diodes which are diodes designed to have a lower reverse breakdown voltage characteristic.

A widely used scheme is that of connecting another IGFET to the input circuit. The drain is connected to the input, the source is connected to ground and the gate is connected to the drain. This circuit is a diode-connected IGFET that requires a particularly large channel compared with that of the IGFET to be protected for the protection IGFET to be effective. The size requirement is a distinct disadvantage.

Still another circuit arrangement has been to connect the drain of a protection circuit IGFET to the input circuit, its source to ground and its gate through a resistor to ground. The protection circuit IGFET goes into an avalanche mode when the spurious input signal causes a reverse bias situation. The resistor drops a very large part of the spurious input voltage, protecting the insulation material under the gate of the protection IGFET. The physical size of the resistor and the manufacturing difficulty in consistently reproducing the ohmic value are disadvantages in this circuit.

BRIEF SUMMARY OF THE INVENTION

The drain of a protection circuit IGFET is attached to the input terminal which is in turn connected to the gate of a main circuit IGFET to be protected. The source of the protection circuit IGFET is connected to ground and its gate is connected to a p-n junction whose other terminal is connected to ground. In operation, the protection circuit IGFET goes into an avalanche mode when reverse biased by a spurious, high voltage input signal. Carriers are injected into the gate, charging the gate and causing the protection circuit IGFET to become conductive, thus causing current to flow to ground through the source. When the spurious signal on the drain of the protection circuit IGFET goes below the avalanche point, the diode permits leakage current to flow to the circuit substrate, discharging the gate and shutting off the protection circuit IGFET. The input is thereby returned to a normal state. When the spurious signal is of the opposite polarity, the protection circuit IGFET is forward biased and the spurious signal thereby immediately shunted into the substrate.

DETAILED DESCRIPTION OF THE INVENTION

Figure 1:
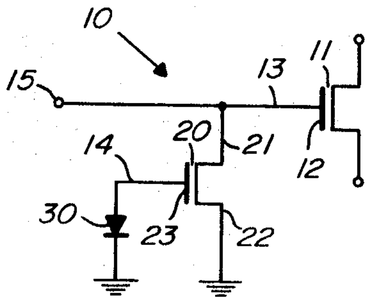
FIG. 1 is a schematic diagram illustrating the protected IGFET and the protection circuit.

FIG. 1 illustrates a circuit 10 having a main circuit IGFET 11 whose base 12 is connected to input terminal 15 via conductor 13. More IGFET's could, of course, be tied to input terminal 15. It should be noted that while the preferred embodiment devices are of the silicon gate type, the well known metal oxide silicon (MOS) could also be used.

IGFET 20 has its drain 21 connected to conductor 13 and has its source 22 connected to ground. The gate 23 of IGFET 20 is connected through conductor 14 to *p-n* junction 30 which is connected to ground. In the preferred embodiment, the protection circuit IGFET 20 is of the P-channel conductivity type. Also, the circuit to be protected may include more IGFET's than IGFET 20 and they may be of the complementary type circuitry such as CMOS. When reference is made to the drain and source, those skilled in the art realize that the terminology is one of convenience, that the drain and source are interchangeable elements of IGFET's.

Figure 2:
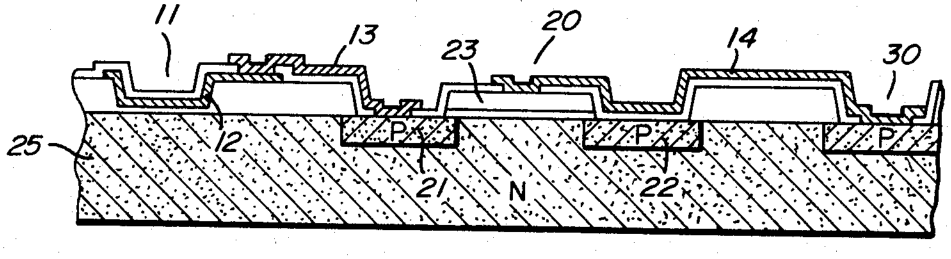
FIG. 2 is a cross-section of a substrate embodying the circuit of the schematic diagram of FIG. 1.

FIG. 2 illustrates, in cross-section, an actual implementation of the circuit of FIG. 1. The gate 12 to be protected is shown connected by metalization or conductor 13 to drain 21 of IGFET 20. The gate 23 of IGFET 20 is shown connected by metalization or conductor 14 to the *p-n* junction 30. FIG. 2 is illustrative of silicon gates being used for both devices 11 and 20, but MOS devices can just as well be used.

The devices are formed on substrate 25 which, if grounded, could conform exactly to the circuit of FIG. 1 which illustrates drain 22 and one electrode of the p-n junction 30 being grounded.

MODE OF OPERATION

When a large amplitude spurious voltage signal is introduced at terminal 15, it is also introduced at drain 21 of protection IGFET 20. If the spurious signal is of a polarity to reverse bias IGFET 20, carriers are injected from drain 21 into gate 23 of IGFET 20. If the spurious signal is of the other polarity, then there is a forward biasing and the spurious signal is conducted to the substrate. In the reverse bias situation, the introduction of carriers from drain 21 into gate 23 of IGFET 20 causes IGFET 20 to go into an avalanche mode. Gate 23 becomes charged up, turning on IGFET 20 it is believed. Therefore current is conducted by way of the avalanche mode to the substrate as well as from the drain 21 to the source 22 of IGFET 20 to ground. When the spurious voltage signal present at drain 21 drops below that required to maintain the avalanche, the charge on gate 23 leaks through diode 30 to the substrate causing the gate to lose its charge in a time range dependent upon the circuit parameters. IGFET 20 is turned off and the input is thereby returned to normal. The circuit is then ready for testing for its intended use.

If the charge were not removed from gate 23 of protection IGFET 20, then that device would be in the ON state when a test voltage is applied at terminal 15. Under those circumstances, current would be conducted through IGFET 20 indicating a faulty main circuit IGFET 11. Therefore, the parameters must be such that not too much time be taken discharging gate 23 of IGFET 20. The following simple calculation based on the ordinary parameters used in this circuit follows:

voltage on gate 23 (V) = 40v
leakage current through junction 30 ($I_j$) = 50*pa/mil*$^2$
IGFET 20 and junction 30 capacitance (C) = 0.2pf
area of junction 30 (A) = 1.0 mil$^2$
charge (Q) = C × V $$= 0.2 \times 10^{-12} \times 40$$

$$= 8 \times 10^{-12} \text{ coulombs}$$

total current ($I_t$) = $I_j \times A$ $$= 50\text{pa/mil}^2 \times 1.0 \text{ mil}^2$$

$$= 50 \text{ pa}$$

leakage time (P) = $Q/I_t$ $$= 8 \times 10^{-12}/50^{-12}$$

$$= 0.16 \text{ seconds}$$

This leakage time of 0.16 seconds is fast enough for a discharge of gate 23 of IGFET 20 to provide a normal input condition for subsequent circuit testing.

I claim:

1. An integrated, input protection circuit, formed upon a substrate, having input means connected to the gate of at least one main circuit, insulated gate field-effect transistor to be protected from spurious high amplitude voltage signals comprising:

a a protection circuit insulated gate field-effect transistor having a gate, and having a drain connected to the input means and a source connected to a common reference for injection of carriers from the drain to the gate in an avalanche mode to charge the gate when a spurious signal of a reverse bias polarity is received; and b a p-n junction connected between the gate of the protection circuit insulated gate field-effect transistor and the common reference in a reverse bias direction, for providing impedance in the gate circuit of the protection circuit insulated gate field-effect transistor and for providing a leakage path for the charge on the gate after the spurious signal decreases to stop the avalanche mode.

2. The circuit of claim 1 wherein the main circuit and the protection circuit insulated gate field-effect transistors are MOS devices.

3. The circuit of claim 1 wherein the protection circuit insulated gate field-effect transistor is of the p-channel conductivity type.

4. The circuit of claim 2 wherein the protection circuit MOS device is of the p-channel conductivity type.

* * * * *